(12) United States Patent
Eda et al.

(10) Patent No.: US 11,115,056 B2
(45) Date of Patent: Sep. 7, 2021

(54) LOCATION SELECTION BASED ON ERASURE CODE TECHNIQUES

(71) Applicant: International Business Machines Corporation, Armonk, NY (US)

(72) Inventors: Sasikanth Eda, Vijayawada (IN); Poornima Gupte, Pune (IN); Sukumar Vankadhara, Bangalore (IN); Sandeep Ramesh Patil, Pune (IN)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 16/006,376

(22) Filed: Jun. 12, 2018

(65) Prior Publication Data

US 2019/0379400 A1 Dec. 12, 2019

(51) Int. Cl.
*H03M 13/15* (2006.01)
*G06F 11/10* (2006.01)

(52) U.S. Cl.
CPC ....... *H03M 13/154* (2013.01); *G06F 11/1076* (2013.01)

(58) Field of Classification Search
CPC .................. H03M 13/154; G06F 11/1076
USPC ........................................................ 714/766
See application file for complete search history.

(56) References Cited

U.S. PATENT DOCUMENTS

| | | | |
|---|---|---|---|
| 5,477,553 A * | 12/1995 | Kong | G06F 11/1044 714/805 |
| 8,099,623 B1 | 1/2012 | Li et al. | |
| 8,101,829 B1 | 1/2012 | Corbin et al. | |
| 8,713,405 B2 | 4/2014 | Healey, Jr. et al. | |
| 9,431,054 B1 * | 8/2016 | Goker | G06F 11/1076 |
| 9,823,876 B2 * | 11/2017 | Poston | G06F 3/065 |
| 2002/0138610 A1 * | 9/2002 | Miyazawa | H04L 29/06 709/224 |
| 2015/0121169 A1 | 4/2015 | Iliadis et al. | |
| 2015/0378820 A1 * | 12/2015 | Doerner | G06F 11/1076 714/766 |
| 2016/0011939 A1 * | 1/2016 | Luby | G06F 11/1076 714/764 |
| 2016/0092109 A1 | 3/2016 | Wu et al. | |
| 2017/0060683 A1 * | 3/2017 | Luby | G06F 3/0644 |
| 2019/0065114 A1 * | 2/2019 | Inoue | G06F 3/0635 |
| 2019/0379400 A1 * | 12/2019 | Eda | G06F 11/1076 |

* cited by examiner

*Primary Examiner* — James C Kerveros
(74) *Attorney, Agent, or Firm* — Kanzler Bean & Adamson (57) ABSTRACT

Systems for location selection based on erasure code techniques are provided. One system includes a monitor module that monitors data speed characteristics for one or more locations on a storage device. Additionally, the system includes a classification module that determines an erasure code technique for an application, wherein data associated with the application is stored on a storage device. Also, the system includes a selection module that selects a location in one or more locations for storing data based on monitored data speed characteristics and a determined erasure code technique.

20 Claims, 8 Drawing Sheets

LOCATION SELECTION BASED ON ERASURE CODE TECHNIQUES

FIELD

This invention relates to storing data and more particularly relates to methods and systems for location selection for storing data based on erasure code techniques.

BACKGROUND

Certain systems may offer a heterogeneous environment for storing data. In at least one example, different applications that execute on computer systems may use different erasure code techniques to reconstruct data. For instance, some applications that execute in a computer system may use Reed-Solomon codes to reconstruct data and other applications may use Parity-Array codes to reconstruct data. Further, different locations on a drive for storing data may offer different data transfer speeds. For example, a drive may be constructed with disks having varying speeds. Further, some disks may have different read/write speeds based on whether the data being read or written is located on an inner or an outer track of the disk.

SUMMARY

Methods and systems for location selection based on erasure code techniques are provided. A system includes a monitor module that monitors data speed characteristics for one or more locations on a storage device. The system also includes a classification module that determines an erasure code technique for an application, wherein data associated with the application is stored on a storage device. The system further includes a selection module that selects a location in one or more locations for storing the data based on monitored data speed characteristics and a determined erasure code technique.

One method includes monitoring data transfer speeds for one or more locations and data transfer speed differences between separate locations in one or more locations. The method also includes identifying a current data chunk and an erasure code technique associated with the current data chunk. Further, the method includes writing the current data chunk to a location in the one or more locations based on the erasure code technique, the data transfer speeds, and the data transfer speed differences.

Also disclosed a computer program product comprising a computer-readable storage medium including program instructions embodied therewith for selecting a location based on adjacent location errors. Some program instructions executable by a processor and cause the processor to monitor data transfer speeds for one or more locations and data transfer speed differences between separate location in the one or more locations. Further, the program instructions cause the processor to identify a current data chunk and an erasure code technique associated with the data chunk. Also, the program instructions cause the processor to write the current data chunk to a location in the one or more locations based on a combination of the erasure code technique, the data transfer speeds, and the data transfer speed differences.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Disclosed herein are various embodiments providing methods, systems, and computer program products that can select locations on a storage device based on characterizations of adjacent location errors. Notably, the language used in the present disclosure has been principally selected for readability and instructional purposes, and not to limit the scope of the subject matter disclosed herein in any manner.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several storage devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

A method that can select locations for storing data based on erasure code techniques may include monitoring data transfer speeds for one or more locations and data transfer speed differences between separate locations in the one or more locations. The method further may include identifying a current data chunk and an erasure code technique associated with the data chunk. The method also may include writing the current data chunk to a location in the one or more locations based on the erasure code technique, the data transfer speeds, and the data transfer speed differences.

In some embodiments, a method for selecting locations may further include monitoring a number of consumed locations in the one or more locations. In certain embodiments, the method may also include classifying the data chunk as a data segment or as a parity segment. Also, in at least one embodiment, the method may include saving the data transfer speeds and the data transfer speed differences. Further, in another embodiment, the method may include updating the saved data transfer speeds and the saved data transfer speed differences in response to the current data chunk being written to the location.

In at least one embodiment, identifying an erasure code technique associated with the data chunk may include selecting the erasure code technique based on information stored in an erasure code technique database.

A system for selecting a location based on error code techniques may include a monitor module that monitors data speed characteristics for one or more locations on a storage device. The system may further include a classification module that determines an erasure code technique for an application, wherein data associated with the application is stored on the storage device. The system may also include a selection module that selects a location in the one or more locations for storing the data based on the monitored data speed characteristics and the determined erasure code technique.

In at least one embodiment, the data speed characteristics may include data transfer speeds for the one or more locations on the storage device and a difference between the data transfer speeds for the one or more locations. In additional embodiments, the monitor module may monitor a number of consumed locations in the one or more locations. In certain embodiments, the classification module may classify a data chunk associated with the application. Further, the classification module may classify the data chunk as a data segment or parity segment. Also, the classification module may determine the erasure code technique based on information stored in an erasure code technique database.

In certain embodiments, the system for selecting a location based on erasure code techniques may also include a write module that writes data to a location. Further, the system may include a disk statistics module that saves the data speed characteristics. Further, the disk statistics module may update the data speed characteristics in response to the data being saved to the location.

Also disclosed are computer program products comprising a computer-readable storage medium including program instructions embodied therewith that can select a location in a storage device based on an erasure code technique. Some program instructions are executable by a processor and cause the processor to monitor data transfer speeds for one or more locations and data transfer speed differences between separate location in the one or more locations. The program instructions further causing a processor to identify a current data chunk and an erasure code technique associated with the data chunk. The program instructions also causing a processor to write the current data chunk to a location in the one or more locations based on a combination of the erasure code technique, the data transfer speeds, and the data transfer speed differences.

In some embodiments, the program instructions further cause the processor to monitor a number of consumed locations in the one or more locations. Also, the program instructions cause the processor to classify the data chunk as a data segment or a parity segment. Additionally, the program instructions cause the processor to select the erasure code technique from an erasure code techniques database. Further, the program instructions cause the processor to save the data transfer speeds and the data transfer speed differences.

The description of elements in each figure below may refer to elements of proceeding Figures. For instance, like numbers can refer to similar elements in all figures, including alternate embodiments of similar elements.

Figure 1:
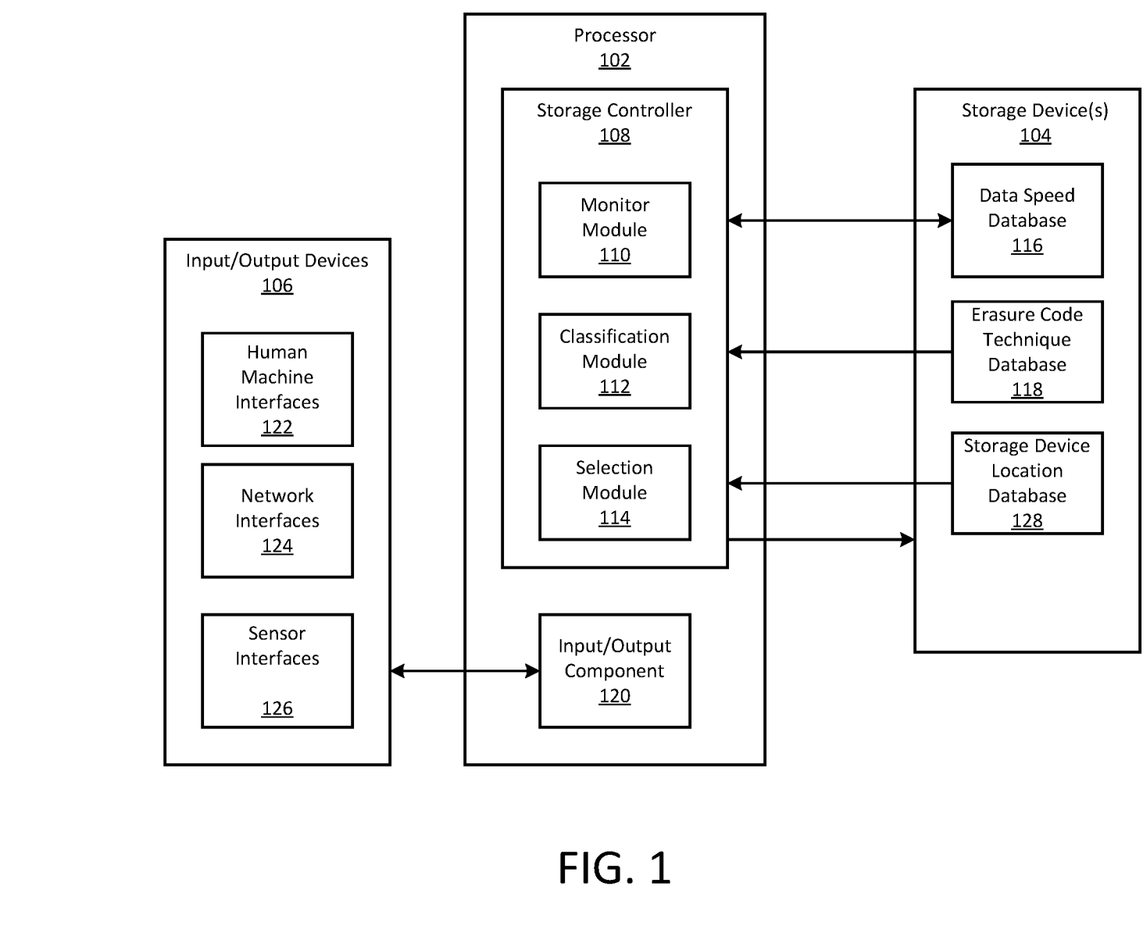
FIG. 1 is a block diagram of one embodiment of a computing system.

With reference now to the figures, FIG. 1 is a diagram illustrating one embodiment of a system 100 for storing data in a storage device. At least in the illustrated embodiment, the system 100 includes, among other components, a processor 102 coupled to several input/output devices 106 and one or more storage devices 104.

In certain embodiments, the processor 102 may be a processor of a general purpose computer, special purpose computer, or other programmable data processing apparatus. As described herein, the processor 102 may execute computer-readable program instructions associated with selecting locations for storing data on a storage device 104 based on erasure code techniques associated with applications executed by the processor 102. In at least one embodiment, the processor 102 may execute computer-readable program instructions associated with a storage controller 108. The storage controller 108 may include multiple modules to control the storing of data on a storage device 104 coupled to the processor 102. For example, the storage controller 108 may include a monitor module 110, a classification module 112, and a selection module 114. Further, to acquire data from sources other than the execution of a computer readable program instructions, the processor 102 may execute computer readable program instructions associated with an input/output component 120.

A storage device 104 may be a suitable type of storage device that is known or developed in the future that can store computer-usable data. In various embodiments, a storage device 104 may include one or more non-transitory computer-usable mediums (e.g., readable, writable, etc.), which may include any non-transitory and/or persistent apparatus or device that can contain, store, communicate, propagate, and/or transport instructions, data, computer programs, software, code, routines, etc., for processing by or in connection with the computer processing device such as processor 102.

In certain embodiments, a storage device 104 may be implemented as a direct-access storage device (DASD). A storage device 104, in further embodiments, may include non-transitory memory such as, for example, flash memory (e.g., a solid-state device (SSD) or other non-volatile storage devices that store persistent data), a dynamic random access memory (DRAM) device, an enhanced dynamic random access memory (EDRAM) device, a static random access memory (SRAM) device, a hard disk drive (HDD), a near-line drive, tape drive (e.g., magnetic and/or virtual), and/or other type(s) (e.g., non-volatile and/or persistent) of data storage devices, etc. that are possible and contemplated herein.

A storage device 104, in various embodiments, may include non-volatile/persistent hardware and/or software configured to perform long-term data storage operations, including, but not limited to, data archiving, data backup, data mirroring, replicating data, etc. For instance, a storage device 104 may include non-volatile and/or persistent hardware and/or software to perform long-term data storage operations, which may include write operations, read operations, read-write operations, etc., among other operations.

In some embodiments, a storage device 104 stores objects (e.g., data, executable programs, source program libraries, etc.). In at least one embodiment, the storage device 104 stores a data speed database 116. A data speed database 116, as described herein, may refer to a data structure that stores data transfer speeds for particular locations in the storage device 104. A location on the storage device 104, as used herein, may refer to a disk, a track, a cell, a page, a block, or other distinguishable portion of a storage device. A data transfer speed, as used herein, may refer to a measurement indicating how much data may be transferred from the storage device 104 in a given timeframe. For example, a data transfer speed may be a number indicating how many megabytes per second may be transferred from the storage device 104 per second. Alternatively, the data speed database 116 may also record the differences between data transfer speeds for the different locations on the storage device 104. For example, when the storage device 104 is a disk, the data speed database 116 may record that outer tracks have slower data transfer speeds than inner tracks.

In certain embodiments, a storage device 104 may also store information regarding erasure code techniques in an erasure code technique database 118. In certain implementations an erasure code technique database 118 may store information regarding erasure code techniques such as benefits and deficiencies of different erasure code techniques, storage device location characteristics that the benefits particular erasure code techniques, or the like. As used herein, an erasure code technique may be a method for data protection where data is broken into fragments, expanded and encoded with redundant data and then stored on a storage media such as storage device 104. In certain embodiments, the redundant data is stored across multiple different locations on the storage device 104. There are multiple techniques for performing erasure coding. In certain embodiments, erasure codes may be maximum distance separable codes such as Reed-Solomon codes and Cauchy Reed-Solomon codes. Alternatively, erasure codes may be parity array codes such as even-odd codes, horizontal versus vertical codes, the XOR code, two weaver code, hover codes, Blaum-Roth codes, and the like. Further erasure codes may be low density parity check codes, evaluating codes, or other approaches for performing erasure coding. The erasure code technique database 118 may store information regarding the different methods of performing erasure coding.

In at least one embodiment, the erasure code technique database 118 may store information describing the trade-offs and benefits associated with the different methods of performing erasure coding. For example, the performance of a Reed-Solomon code is greater when data objects are reconstructed from data segments. Further, the performance of parity-array codes is mostly equal when comparing reconstruction of data from data segments to reconstruction of data from combinations of data and parity segments. As such the erasure code technique database 118 may store information describing which erasure code techniques benefit from different data arrangements, data transfer speeds, and the like. In at least one embodiment, the storage device 104 may also store a storage device location database 128. The storage device location database 128 may, in certain embodiments, store information regarding which locations on a storage device currently store data.

In certain embodiments, the location selection for storing data on a hard drive may be randomized. As such the selection of disk locations for writing data, parity segments, and the like may be inefficient because of the effects of erasure code techniques on certain locations on the storage device 104.

In certain embodiments, a storage device 104 may be controlled by a storage controller 108. The storage controller 108 may be computer readable instructions that are executed by a processor 102. As described above, the storage controller 108 may include a monitor module 110, a classification module 112, and a selection module 114. In certain embodiments, the monitor module 110 may monitor data speed characteristics for one or more locations on the storage device 104. For example, the monitor module 110 may maintain a data structure in the data speed database 116 for storing information describing the data transfer speed for the separate locations on the storage device 104. In certain embodiments, monitor module 110 may store information regarding the difference between the data transfer speeds for different locations on a storage device 104.

In further embodiments, the storage controller 108 may include a classification module 112 that classifies storage device locations on the storage device 104 to determine what type of data to store on the particular location in the storage device 104. The classification module 112 may use information stored in the data speed database 116 regarding the data transfer speeds for the different locations on the storage device 104. The classification module 112 may also use information stored in the erasure code technique database 118 regarding characteristics of different erasure code techniques. The classification module 112 may use the information in both the data speed database 116 and erasure code technique database 118 to determine whether a particular location on the storage device 104 should be used for parity information or data information.

In at least one embodiment, the classification module 112 may identify an erasure code technique associated with data, or data chunk, to be stored on the storage device 104. As used herein, data or data chunk may refer to information to be stored on the storage device. When the classification module 112 identifies the erasure code technique, the classification module 112 may use information in the erasure code technique database 118 to identify trade-offs associated with that particular erasure code technique and, accordingly, to identify locations on the storage device 104 that may mitigate the deficiencies of the erasure code technique and take advantage of the proficiencies of the particular erasure code technique. For example, the classification module 112 may identify that an erasure code technique associated with data to be stored in the storage device 104 is a Reed-Solomon erasure code. As part of the Reed-Solomon erasure code, data may be reconstructed from data segments. As data is reconstructed from data segments, for the Reed-Solomon erasure code, the classification module 112 may determine that data associated with the Reed-Solomon erasure code should be stored in storage device locations having faster data transfer speeds.

In a further embodiment, the classification module 112 may identify that an erasure code technique associated with data to be stored on the storage device 104 is a parity array code. As part of the parity array code, parity data may be used to correct errors in the information stored on the storage device 104. In certain embodiments, parity data may not benefit from being stored in storage device locations having faster data transfer speeds as compared to erasure code techniques that reconstruct data from data stored on the storage device 104. As parity array codes can be stored in locations having slower data transfer speeds, the classification module 112 may identify the data to be stored on the storage device 104.

In at least one embodiment, the selection module 114 may select a location on the storage device 104 based on classification information produced by the classification module 112. For example, when the classification module 112 determines that data should be stored at a location on the storage device 104 having a fast data transfer speed, the selection module 114 may use information stored in the data speed database 116 to identify locations on the storage device 104 having faster data transfer speeds. Also, when the classification module 112 determines that data to be stored at a location, on storage device 104, having a slower data transfer speed, the selection module 114 may use information stored in the data speed database 116 to identify locations on the storage device 104 having slower data transfer speeds. When the selection module 114 selects a location on the storage device 104 for storing data, the storage controller 108 may store data at the selected location on the storage device 104.

Further, in certain embodiments, the processor 102 may receive data through an input/output component 120. The input/output component 120 may be an interface or interfaces for receiving data. For example, the input/output component 120 may receive data for processing by the processor 102 through a bus, a transceiver, or other communicative medium. In certain embodiments, the input/output component 120 may be connected to one or more input/output devices 106. The input/output devices 106 may include human machine interfaces 122. Human machine interfaces 122, as used herein, may refer to an interface that translates human interaction with the machine into machine-readable information. For example, human machine interfaces 122 may include a mouse, a keyboard, a touchscreen, a microphone, and the like. Further, the input/output devices 106 may include network interfaces 124. A network interface 124, as used herein, may refer to an interface for communicating with another device. For example, the network interface 124 may include a local network connection, an Internet connection, and the like. Also, the input/output devices 106 may include sensor interfaces 126. Sensor interfaces 126, as used herein may refer to an interface where a sensor produces machine readable information gathered from sensing an environment local to a sensing device. Sensor interfaces 126 may include a thermometer, a pressure sensor, a lidar, camera, and the like.

In at least one embodiment, the input/output component 120 provides data to the processor 102 that may potentially be stored on the storage device 104. Also, the processor 102 may generate data to be stored on the storage device 104 by processing data received from the input/output component 120 and/or processing data received from the storage device 104. In at least one embodiment, when the processor 102 generates data to be stored on the storage device 104, the storage controller 108 may use the monitor module 110, the classification module 112, and the selection module 114 to identify a location on the storage device 104 that may aid in correcting errors associated with the data generated by the processor 102. Accordingly, by being aware of the effects of storage device location on erasure code techniques, the storage controller 108 may more efficiently use the storage device 104 for performing erasure coding.

Figure 2:
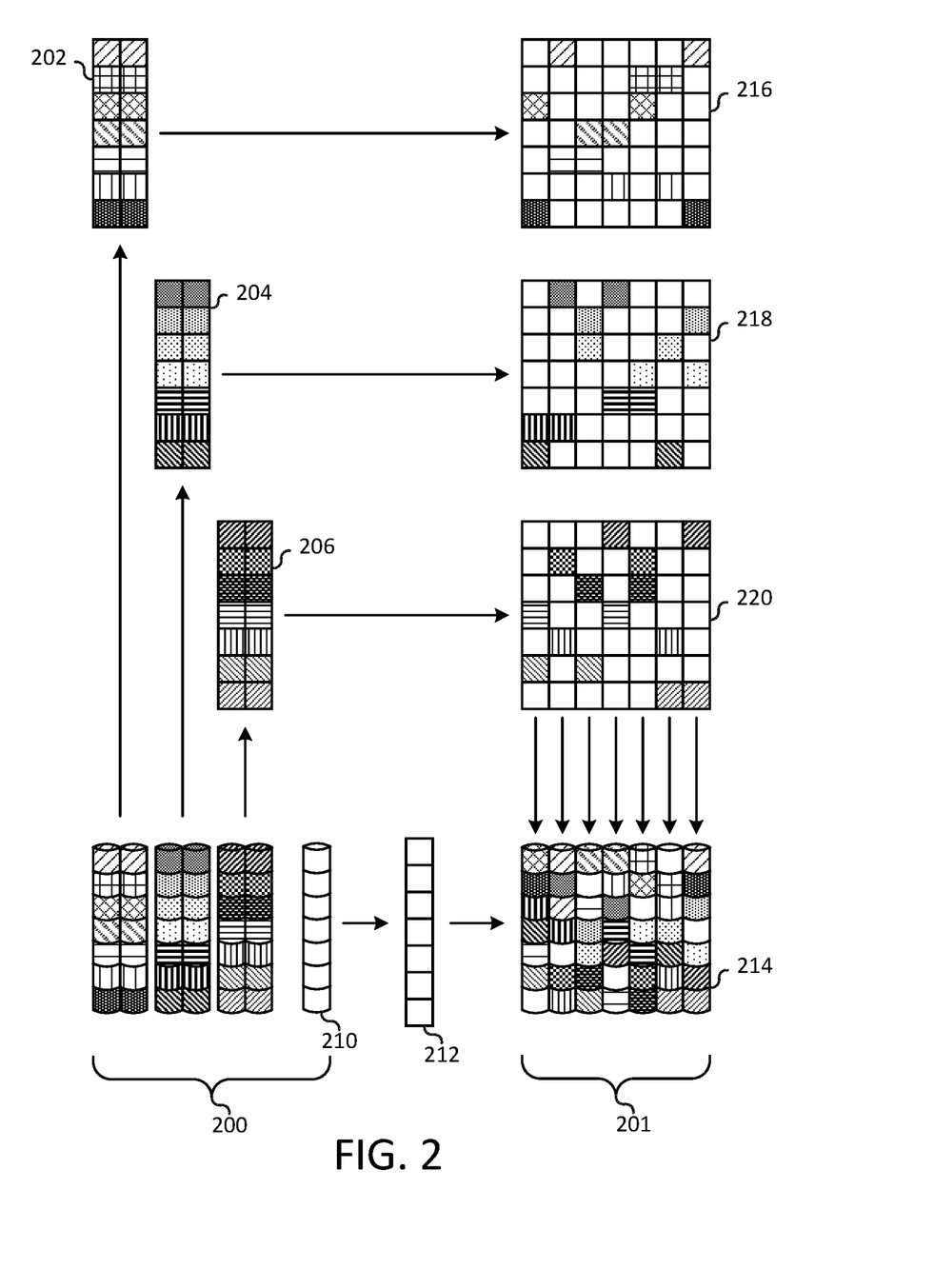
FIG. 2 is a diagram illustrating one embodiment of a declustered RAID storage device.

FIG. 2 is a block diagram illustrating a comparison of a conventional RAID storage device 200 to a declustered RAID storage device 201. As described above, the storage device 104 may be implemented as a conventional RAID storage device 200. Alternatively, the storage device 104 may be a declustered RAID storage device 201. As shown, the RAID storage device 200 may include three different storage arrays. The RAID storage device 200 may include a first storage array 202, a second storage array 204, and a third storage array 206. In certain embodiments, an array may have two tracks per array spread across seven hard drive disks. In certain embodiments, a first track may be a data track and a second track may be a replica track of the first track. As illustrated, the first storage array 202, second storage array 204, and the third storage array 206 individually have a first track and a replica track, where the replica track and the first track store the same data. In at least one embodiment, the RAID storage device 200 may include an additional spare disk 210.

In contrast to the conventional RAID storage device 200, the declustered RAID storage device 201 may spread the data across the multiple discs in the storage device 104. For example, to decluster the data in a conventional RAID storage device 200, the RAID storage device 200 may be divided into the first storage array 202, the second storage array 204, and the third storage array 206. The first storage array 202, second storage array 204, and a third storage array 206 may be divided into seven tracks, where there are two strips per array. The different strips from the different arrays may then be combinatorially spread across the different disk positions. For example, the strips of the first storage array 202 may be combinatorially spread across the seven disk positions as illustrated in first virtual disk 216. The strips of the second storage array 204 may be combinatorially spread across the seven disk positions as illustrated in second virtual disk 218. The strips of the third storage array 206 may be combinatorially spread across the seven disk positions as illustrated in third virtual disk 220. In certain embodiments, the first virtual disk 216, the second virtual disk 218, and the third virtual disk 220 may be combined as illustrated in declustered RAID storage array 214. As illustrated, the different strips from the separate virtual disks may be vertically stacked upon one another within the declustered RAID storage array 214. Further, an additional array of spare strips may be inserted in the declustered RAID storage array 214, where a single spare strip is inserted per disc.

In certain embodiments, the storage controller 108 of FIG. 1 may store data in the declustered RAID storage device 201 in a location selected by the selection module 114 to more efficiently take advantage of erasure code techniques. For example, when spreading the strips of the different storage arrays across a disk, the selection module 114 may select locations on the disk based on the effects of data transfer speeds on erasure code techniques. For example, when data is associated with erasure codes that use data segments to correct erasures, the selection module 114 may select locations on the disk that have faster data transfer speeds for storing the data. Also, when data is associated with erasure codes that use parity data to correct erasures, the selection module 114 may select locations on the disk that have lower data transfer speeds for storing the data.

Figure 3A:
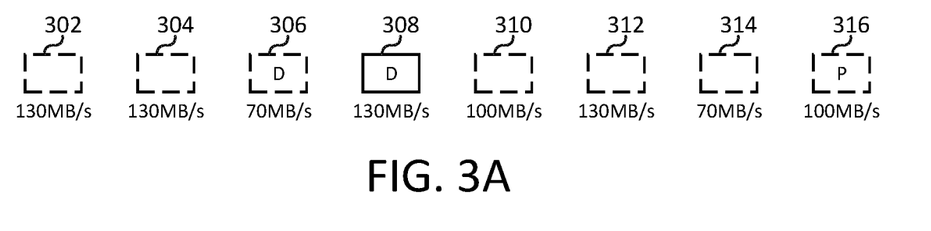
FIGS. 3A-3D is a diagram illustrating embodiments of storage locations on a storage device.
Figure 3B:
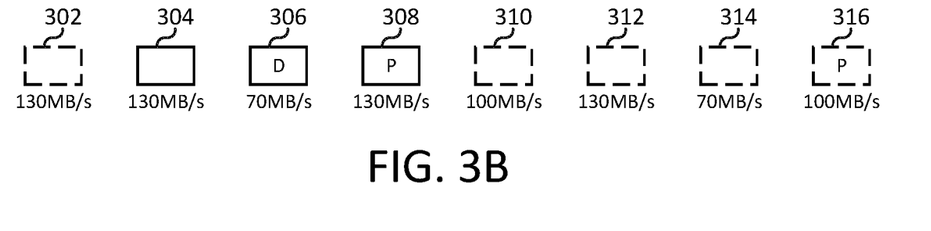
Figure 3C:
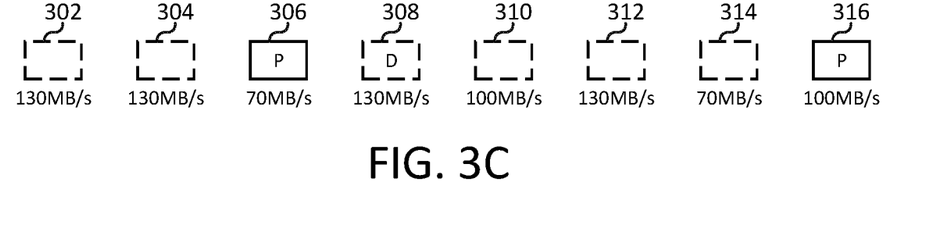
Figure 3D:
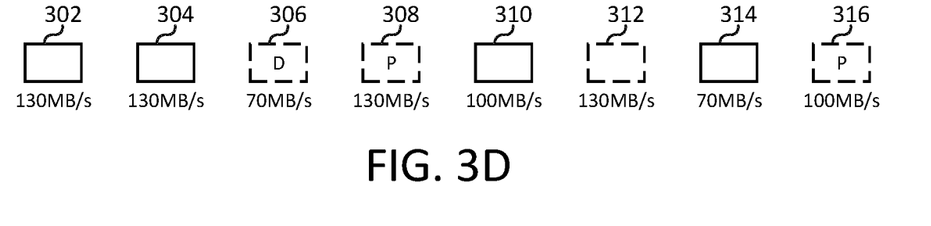

FIGS. 3A through 3B illustrate the saving of data at different locations on a storage disk, such as storage device 104. In particular, FIG. 3A illustrates an embodiment where location selection is random. FIG. 3B illustrates another embodiment where locations are selected at random. FIGS. 3C and 3D illustrate embodiments where location selection is based on data transfer speeds and erasure code techniques associated with the data being saved.

For example, as illustrated in FIG. 3A, a storage controller 108 may randomly assign locations on a storage device 104 for storing particular types of data. For example, a storage controller 108 may randomly store data segments and parity segments in different locations on a drive. As illustrated, a disk drive may have multiple disks that are capable of transferring data at different speeds. For example, a disk drive may include a first drive 302, a second drive 304, a third drive 306, a fourth drive 308, a fifth drive 310, a sixth drive 312, a seventh drive 314, and an eighth drive 316. As illustrated in FIG. 3A, the first drive 302, the second drive 304, the fourth drive 308, and the sixth drive 312 may be capable of transferring data up to 130 MB per second. Further, the fifth drive 310 and the eighth drive 316 may be capable of transferring data up to 100 MB per second. Also, the third drive 306 and the seventh drive 314 may be capable of transferring data up to 70 MB per second. Further, data may be stored at an inner or an outer track of a particular disk drive. As illustrated, a location on a drive is an inner track when the border of the particular box is a solid line. Also, a location on a drive is an outer track when the border of the particular box is a dashed line. As disks may spin around, locations that are at outer tracks of the disk may have faster data transfer speeds when compared to inner tracks of a particular disk.

In certain embodiments, the storage controller 108 may store data segments on an outer track of the third disk 306 which has a data transfer speed of 70 MB per second. Also, the storage controller 108 may store data segments on an inner track of the fourth disk 308 which has a data transfer speed of 130 MB per second. As one data segment is stored on the third disk which has a slow data transfer speed and the other data segment is stored on an inner track of a disk, the data segments may be stored in locations such that erasure code techniques that use the data segments for erasure coding may be inefficient. Also, the storage controller 108 may store a parity segment on an outer track of the eighth disk 316, where erasure code techniques that use the parity segment for erasure coding may not benefit from faster storage device locations as compared to the benefit available to data segments.

For example, as illustrated in FIG. 3B, a storage controller 108 may randomly assign locations on a storage device 104 for storing particular types of data. For example, a storage controller 108 may randomly store data segments and parity segments in different locations on a drive. As illustrated, a disk drive may have multiple disks that are capable of transferring data at different speeds. For example, a disk drive may include a first drive 302, a second drive 304, a third drive 306, a fourth drive 308, a fifth drive 310, a sixth drive 312, a seventh drive 314, and an eighth drive 316. As illustrated in FIG. 3B, the first drive 302, the second drive 304, the fourth drive 308, and the sixth drive 312 may be capable of transferring data up to 130 MB per second. Further, the fifth drive 310 and the eighth drive 316 may be capable of transferring data up to 100 MB per second. Also, the third drive 306 and the seventh drive 314 may be capable of transferring data up to 70 MB per second. Further, data may be stored at an inner or an outer track of a particular disk drive. As illustrated, a location on a drive is an inner track when the border of the particular box is a solid line. Also, a location on a drive is an outer track when the border of the particular box is a dashed line. As disks may spin around, locations that are at outer tracks of the disk may have faster data transfer speeds when compared to inner tracks of a particular disk.

In certain embodiments, the storage controller 108 may store data segments on an inner track of the third disk 306 which has a data transfer speed of 70 MB per second. As the data segment is stored on an inner track of a disk having a slower data transfer speed, the data segment may be stored in a location such that erasure code techniques that use the data segments for erasure coding may be inefficient. Also, the storage controller 108 may store a parity segment on an inner track of the fourth disk 308 and an outer track of the eighth disk 316, where erasure code techniques that use the parity segment for erasure coding may not benefit from faster storage device locations as compared to the benefit available to data segments.

For example, as illustrated in FIG. 3C, a storage controller 108 may assign locations on a storage device 104 for storing particular types of data based on data transfer speeds and erasure code techniques. For example, a storage controller 108 may store data segments and parity segments in different locations on a drive. As illustrated, a disk drive may have multiple disks that are capable of transferring data at different speeds. For example, a disk drive may include a first drive 302, a second drive 304, a third drive 306, a fourth drive 308, a fifth drive 310, a sixth drive 312, a seventh drive 314, and an eighth drive 316. As illustrated in FIG. 3C, the first drive 302, the second drive 304, the fourth drive 308, and the sixth drive 312 may be capable of transferring data up to 130 MB per second. Further, the fifth drive 310 and the eighth drive 316 may be capable of transferring data up to 100 MB per second. Also, the third drive 306 and the seventh drive 314 may be capable of transferring data up to 70 MB per second. Further, data may be stored at an inner or an outer track of a particular disk drive. As illustrated, a location on a drive is an inner track when the border of the particular box is a solid line. Also, a location on a drive is an outer track when the border of the particular box is a dashed line. As disks may spin around, locations that are at outer tracks of the disk may have faster data transfer speeds when compared to inner tracks of a particular disk.

In certain embodiments, the storage controller 108 may store data segments on an outer track of the fourth disk 308 which has a data transfer speed of 130 MB per second. As the data segment is stored on an outer track of a disk having a faster data transfer speed, the data segment may be stored in a location such that erasure code techniques that use the data segments are able to benefit from the characteristics of the location in the disk drive. Also, the storage controller 108 may store a parity segment on an inner track of the third disk 306 and an inner track of the eighth disk 316, where erasure code techniques that use the parity segment for erasure coding may not benefit from faster storage device locations as compared to the benefit available to data segments. Accordingly, the faster storage device locations may be used for purposes that could potentially benefit more from the faster storage device locations.

For example, as illustrated in FIG. 3D, a storage controller 108 may assign locations on a storage device 104 for storing particular types of data based on data transfer speeds and erasure code techniques. For example, a storage controller 108 may store data segments and parity segments in different locations on a drive. As illustrated, a disk drive may have multiple disks that are capable of transferring data at different speeds. For example, a disk drive may include a first drive 302, a second drive 304, a third drive 306, a fourth drive 308, a fifth drive 310, a sixth drive 312, a seventh drive 314, and an eighth drive 316. As illustrated in FIG. 3D, the first drive 302, the second drive 304, the fourth drive 308, and the sixth drive 312 may be capable of transferring data up to 130 MB per second. Further, the fifth drive 310 and the eighth drive 316 may be capable of transferring data up to 100 MB per second. Also, the third drive 306 and the seventh drive 314 may be capable of transferring data up to 70 MB per second. Further, data may be stored at an inner or an outer track of a particular disk drive.

In certain embodiments, the storage controller 108 may store data segments on an outer track of the third disk 308 which has a data transfer speed of 70 MB per second. As the data segment is stored on an outer track of a disk, the data segment may be stored in a location such that erasure code techniques that use the data segments are able to benefit from the characteristics of the location in the disk drive. Also, the storage controller 108 may store a parity segment on outer tracks, such as outer tracks of the fourth disk 308 and the eighth disk 316. As such, erasure code techniques that use the parity segment for erasure coding may benefit from faster storage device locations.

Figure 4:
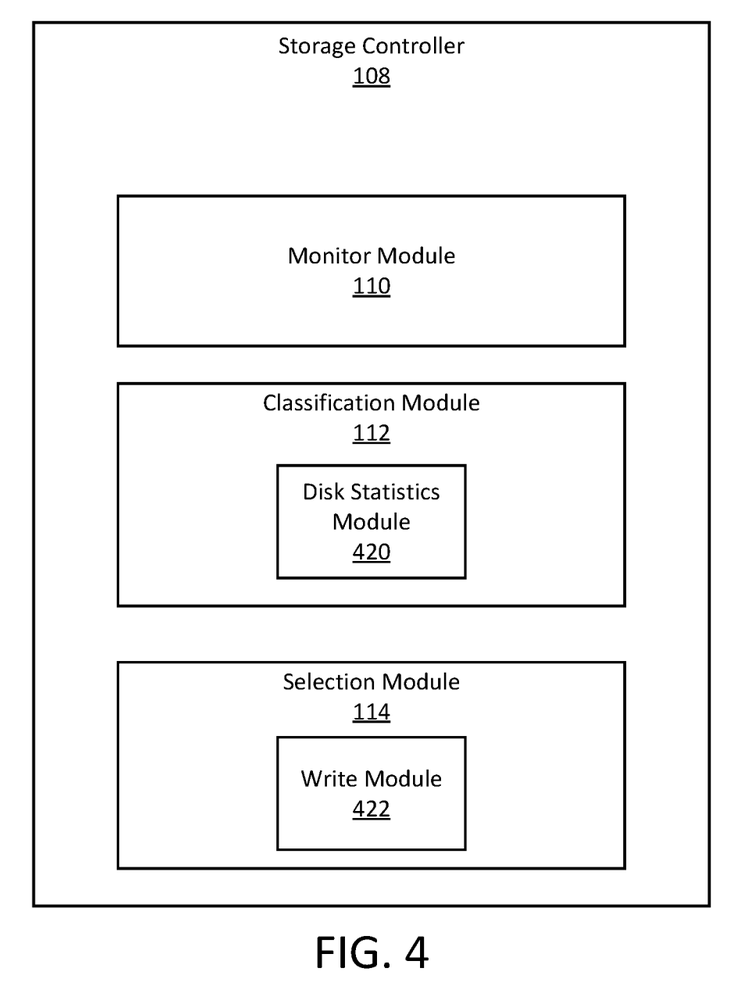
FIG. 4 is a block diagram illustrating one embodiment of a storage controller for selecting locations based on erasure code techniques.

FIG. 4 depicts another embodiment of a storage controller 108. The storage controller 108, in various embodiments may be substantially similar to the storage controller 108 described above with regards to FIGS. 1 through 3. In the depicted embodiment, the storage controller 108 includes a monitor module 110, a classification module 112, and a selection module 114, which may be configured substantially similar as described above with regards to the monitor module 110, classification module 112, and the selection module 114 described above with respect to FIG. 1. For example, the monitor module 110 may monitor data speed characteristics for one or more locations on a storage device. For example, the monitor module 110 may also maintain a data structure in a data speed database for storing information describing the data transfer speed for the separate locations on the storage device. In certain embodiments, the monitor module 110 may also store information regarding the difference between the data transfer speeds for different locations on a storage device. Further, the classification module 112 may classify storage device locations on a storage device to determine what type of data to store on the particular location on the storage device. Also, the classification module 112 may classify data based on erasure code techniques associated with the data. Further, the selection module 114 may select a location on the storage device for writing the data based on the erasure code technique associated with the data. Additionally, the classification module 112 may include a disk statistics module 420. Also, the selection module 114 may include a write module 422.

The disk statistics module 420, in one embodiment, is configured to save speed characteristics for different locations within a storage device, such as the storage device 104. As used herein, the speed characteristics may refer to the data transfer speeds for different locations on a storage device. For example, where the storage device 104 is a hard disk drive, having multiple disks, the disk statistics module 420 may determine the data transfer speeds for the different disks. Further, the disk statistics module 420 may also determine the data transfer speeds for different locations on a single disk based on whether the location is at an inner track or an outer track on the disk. For example, the disk statistics module 420 may store data in a data speed database that indicates that storage device addresses associated with inner track locations have slower data transfer speeds than storage device addresses associated with outer track locations. In at least one embodiment, the disk statistics module 420 may store information regarding the difference in data transfer speeds between different locations on a disk or between different disks. For example, the disk statistics module 420 may store information that identifies a particular location on a disk and then saves the difference between other locations on the disk and the particular location. In summary, the disk statistic module 420 saves information regarding a storage device such that a processor may access the data transfer speeds for the different locations on the storage device. In at least one embodiment, the disk statistics module 420 may update speed characteristics for the storage device when data is stored on the storage device. Alternatively, the disk statistics module 420 may update speed characteristics periodically or whenever a change in the disk statistics module 420 occurs.

The write module 422, in one embodiment, is configured to write data to a location as determined by the selection module 114. For example, when the selection module 114 determines that a particular location is suitable for storing a particular type of data, the write module 114 may write data to the location based on the determination by the selection module 114 that a particular location is suitable for storing a particular data type. For example, when data to be written is to be used for data segments as compared to parity data, the selection module 114 may select an outer track or location on a fast disk to store the data. When the selection module 114 has made the selection, the write module 422 may write data to the location.

Figure 5:
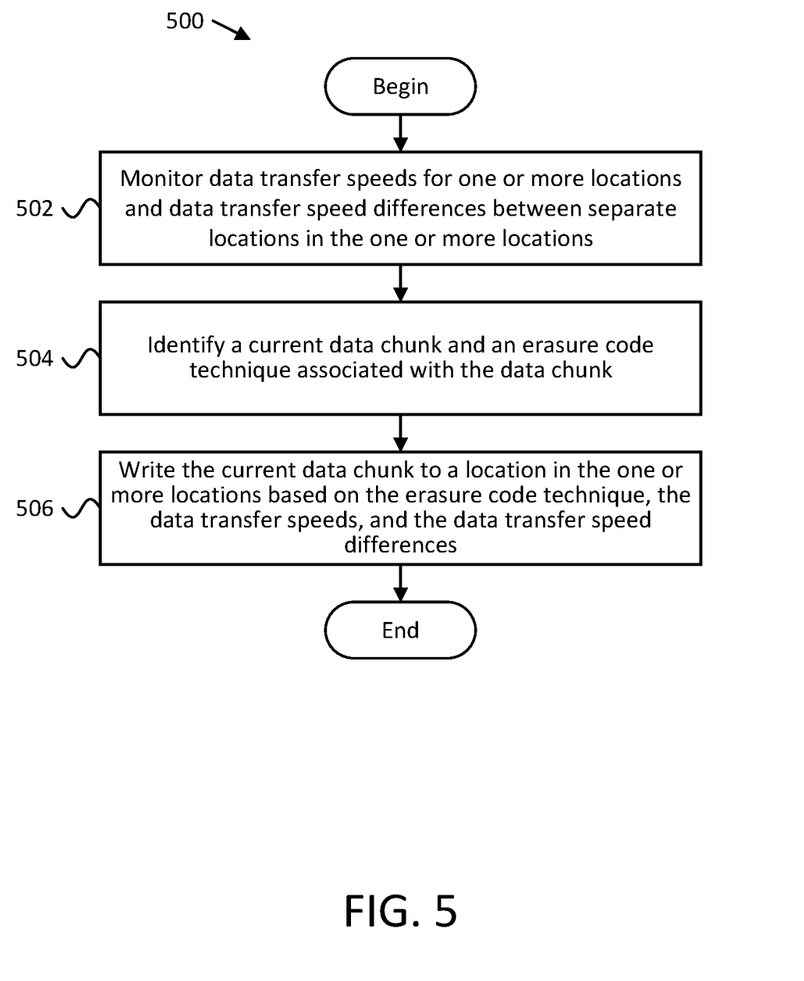
FIG. 5 is a flow chart diagram illustrating one embodiment of a method for selecting locations based on erasure code techniques.

FIG. 5 depicts one embodiment, of a method 500 for a location selection based on erasure code techniques. The method 500 begins, and the monitor module 110 monitors 502 data transfer speeds for one or more locations and data transfer speed differences between separate locations in the one or more locations. For example, the monitor module 110 may monitor the different data transfer speeds for a storage device, such as a hard disk drive. When a hard disk drive includes multiple disks, the monitor module 110 may identify the data transfer speeds associated with each of the separate disks in the hard disk drive. Further, the monitor module 110 may identify the different data transfer speeds associated with different location on a disk of a hard disk drives. For example, the monitor module 110 may determine whether a location is an outer track on a disk or an inner track on a disk. The monitor module 110 may use this information to compare the data transfer speeds for the different locations on the storage device.

In certain embodiments, the method 500 proceeds, and the classification module 112 identifies a current data chunk and an erasure code technique associated with the data chunk. For example, the classification module 112 may use information stored in an erasure code technique database that describes information regarding erasure code techniques along with advantages and tradeoffs associated with the different erasure code techniques. In at least some embodiments, a classification module 112 may identify the application that produced the data chunk and then the classification module 112 may identify the erasure code technique associated with the application.

The method 500 proceeds, and the selection module 114 writes the current data chunk to a location in the one or more locations based on the erasure code technique, the data transfer speeds, and the data transfer speed differences. The method 500 then ends. For example, the selection module 114 may use the information in the erasure code technique database, the identification of the erasure code technique associated with the data chunk, and information regarding the data transfer speeds of the different locations on the storage device to select a location on the storage device that is suited to the associated erasure code technique.

Figure 6:
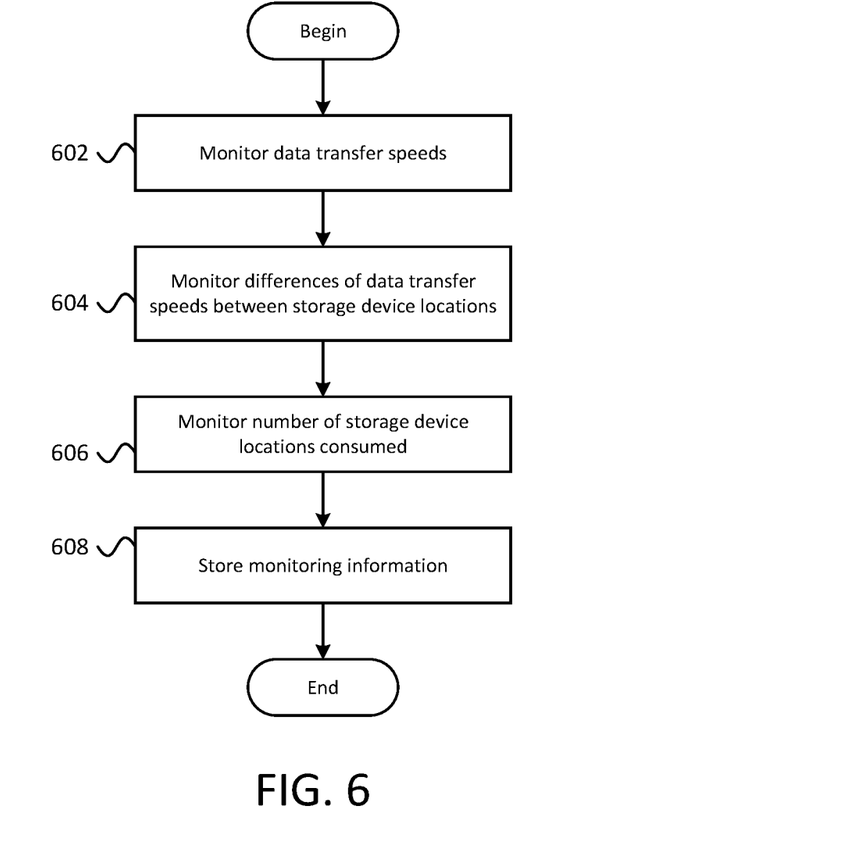
FIG. 6 is a flow chart diagram illustrating a further embodiment of a method for gathering information related to operation of a storage device.
Figure 7:
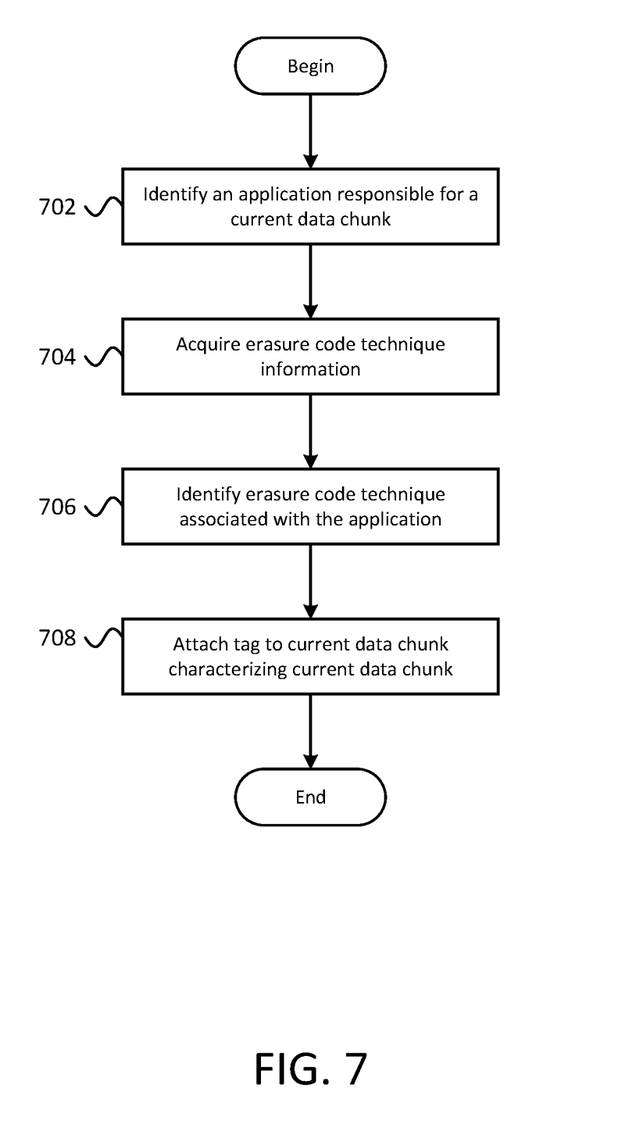
FIG. 7 is a flow chart diagram illustrating a further embodiment of a method for classifying data chunks based on erasure code techniques.
Figure 8:
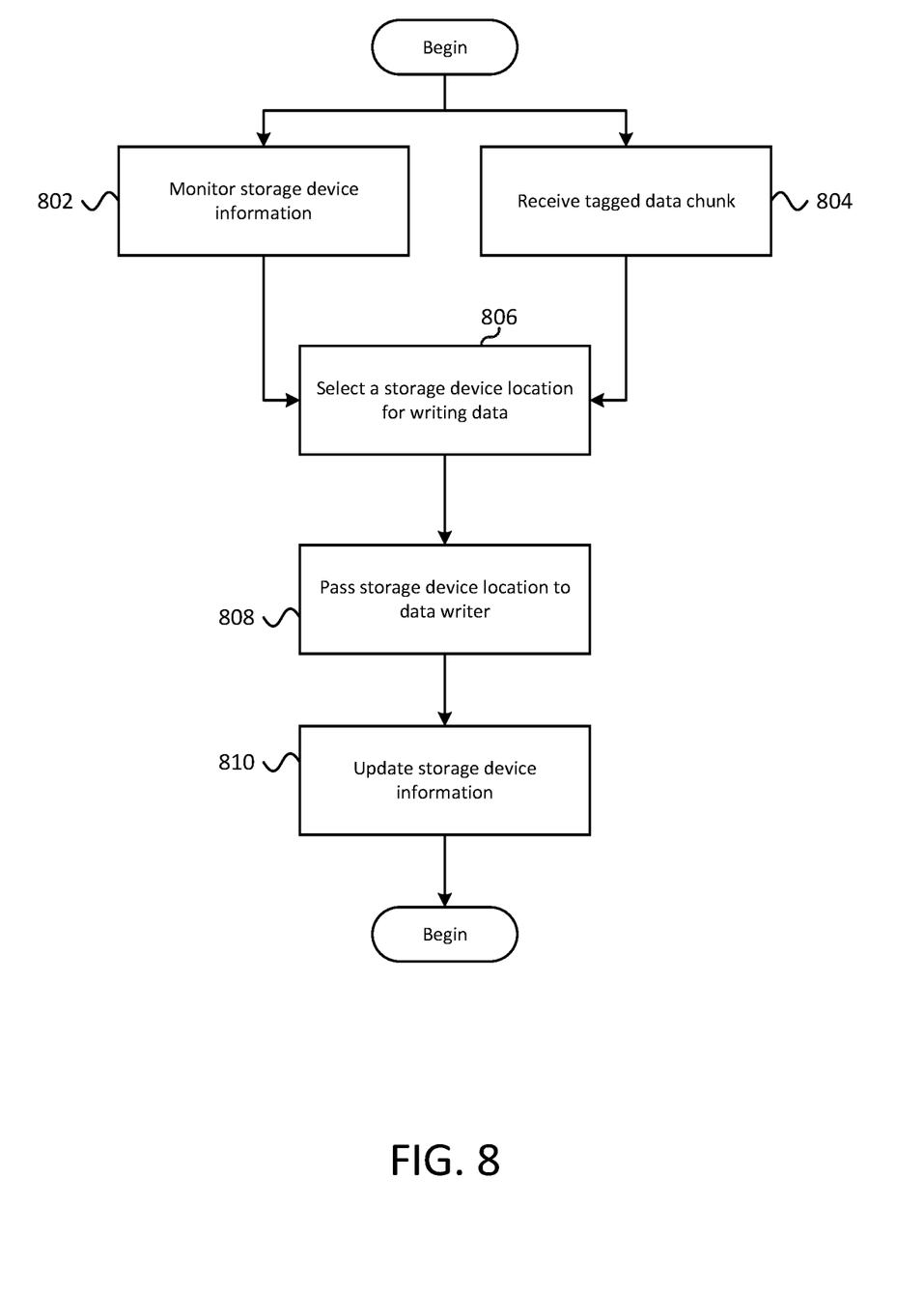
FIG. 8 is a flow chart diagram illustrating one embodiment of a method for selecting locations for storing data based on erasure code techniques.

FIGS. 6-8 depict further embodiments of the steps of method 500. For example, FIG. 6 depicts a further embodiment of a method 600 for monitoring data transfer speeds and data transfer speed differences between separate locations on a storage device. The method 600 begins at 602, where data transfer speeds are monitored. For example, the monitor module 110 may monitor the rate at which data is transferred from different locations on a storage device. Further, the method 600 proceeds at 604, where differences of data transfer speeds are monitored between storage device locations. Based on the monitored data transfer speeds, the monitor module 110 may compare the data transfer speeds for the separate locations against one another, to determine which locations have the faster and slower data transfer speeds. Also, the method 600 proceeds at 606, where a number of storage device locations consumed is monitored.

As used herein, a storage device location is consumed when it is presently storing valid data. Further, the monitor module 110 may identify the locations on the storage device that are presently storing data. Additionally, the method 600 proceeds at 608, where monitoring information is stored. The monitor module 110 may store information regarding the data transfer speeds, the differences between the data transfer speeds for the different locations on a storage device, and which locations are consumed in a data speed database and a storage device location database. The method 600 then ends.

FIG. 7 depicts an embodiment of a method 700 for classifying information to be stored on a storage device. The method 700 begins at 702, where an application responsible for a current data chunk is identified. As used herein, the current data chunk may be the data chunk that is presently being saved to the storage device. The method 700 then proceeds at 704, where erasure code technique information is acquired. For example, the classification module 112 may acquire information regarding different erasure code techniques from an erasure code technique database. Further, the method 700 then proceeds at 706, where an erasure code technique associated with the application is identified. Also, the method 700 then proceeds at 708, where a tag is attached to the current data chunk characterizing the current data chunk. For example, the classification module 112 may identify the erasure code technique associated with the data chunk based on the application that is associated with the data chunk. In at least one implementation, the classification module 112 may tag the data chunk by data type. For instance, the classification module 112 may tag the data chunk as a data segment or parity data. Alternatively, the classification module 112 may tag the data chunk by the erasure code technique associated with the data chunk. The method 700 then ends.

FIG. 8 depicts an embodiment of a method 800 for selecting a location on a storage device for storing information. The method 800 begins at 802 and 804. For example, the method 800 proceeds at 802, where storage device information is monitored. For example, the storage device may be monitored as described above with respect to method 600. While storage device information is monitored, the method 800 proceeds at 804, where a tagged data chunk is received. For example, a data chunk may be tagged as described above with respect to method 700. When the tagged data chunk is received, the method 800 then proceeds at 806, where information from the monitored storage device information and information regarding the tagged data chunk is used to select a storage device location for writing data. For example, the selection module 114 may identify a location on the storage device that is beneficial to the erasure code technique associated with the data chunk. For instance, when the data chunk is associated with an erasure code technique that uses data segments to reconstruct data, the selection module 114 may select available locations in a storage device that has faster data transfer speeds to store the data segments. Alternatively, when the data chunk is associated with an erasure code technique that uses parity information to reconstruct data, the selection module 114 may select available locations having slower data speeds to store the parity data. When a storage device location is selected, the method proceeds at 808, where a storage device location is passed to the data writer. For example, the data writer may write data to the selected location on the storage device. Further, the method proceeds at 810, where storage device information is updated. After, data is written to the storage device, the storage device location database may be updated to reflect changes to locations that store information. The method 800 then ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
a disk drive comprising a plurality of storage disks implementing a Random Array of Independent Disks (RAID) storage device configuration, wherein:
each storage disk of the plurality of storage disks in the disk drive includes at least an inner storage track and an outer storage track for storing data,
at least one storage disk in the plurality of storage disks includes a fast storage disk, and
at least one storage disk in the plurality of storage disks includes a slow storage disk,
a monitor module that:
monitors data speed characteristics for each storage location of a plurality of storage locations positioned on each storage disk in the plurality of storage disks of the disk drive, and
determines a current data transfer speed for each storage location of the plurality of storage locations positioned on the plurality of storage disks based on the monitored data speed characteristics for each storage location, wherein:
each storage location is positioned on a storage track of a storage disk comprising one of:
the outer storage track positioned on any storage disk of the plurality of storage disks,
the inner storage track positioned on any storage disk of the plurality of storage disks,
any storage track positioned on the fast storage disk,
any storage track positioned on the slow storage disk,
the outer storage track positioned on the slow storage disk,
the inner storage track positioned on the slow storage disk,
the outer storage track positioned on the fast storage disk, and
the inner storage track positioned on the fast storage disk, and
storage locations positioned on the outer storage track of each storage disk include faster data transfer speeds than storage locations positioned on the inner storage track of the same storage disk, and
determines data transfer speed differences between each different storage location in the plurality of storage locations positioned on the plurality of storage disks of the disk drive;
a classification module that determines each erasure code technique of a plurality of erasure code techniques associated with each data chunk of a plurality of data chunks; and
a selection module that selects a storage location in the plurality of storage locations on the plurality of storage disks of the disk drive for storing each data chunk based on a correlation of the current data transfer speed of each storage location and an erasure code technique associated with each respective data chunk, wherein:
the current data transfer speed of each storage location in the plurality of storage locations on the plurality of storage disks of the disk drive corresponds to a data transfer speed of a plurality of data transfer speeds,
each erasure code technique in the plurality of erasure code techniques is associated with one of the data transfer speeds in the plurality of data transfer speeds,
at least two erasure code techniques include different data transfer speeds in the plurality of data transfer speeds, and
the selected storage location is selected based on an intersection of the current data transfer speed determined for the storage location, the erasure code technique associated with a data chunk for storage at the selected storage location, and a data transfer speed difference between the selected storage location and at least one other storage location in the disk drive.

2. The system of claim 1, wherein the monitor module further monitors a quantity of consumed storage locations in the plurality of storage locations when storing valid data.

3. The system of claim 1, wherein the classification module classifies each data chunk as including a data segment or as including a parity segment.

4. The system of claim 3, wherein:
the selected storage location for the data segment is a first selected storage location;
the selected storage location for the parity segment is a second selected storage location;
the first selected storage location includes a faster data transfer speed than the second selected storage location; and
data segments are stored at faster storage locations than parity segments.

5. The system of claim 1, wherein the classification module assigns the erasure code technique based on information stored in an erasure code techniques database.

6. The system of claim 1, further comprising a disk statistics module that saves the plurality of data transfer speeds.

7. The system of claim 6, wherein the disk statistics module updates the plurality of data transfer speeds in response to the data chunk being saved to the selected storage location.

8. The system of claim 1, wherein the plurality of storage disks of the disk drive implement a declustered RAID storage device configuration.

9. The system of claim 1, wherein the plurality of storage disks of the disk drive implement a conventional RAID storage device configuration.

10. A method, comprising:
monitoring data transfer speeds for each storage location of a plurality of storage locations located on a plurality of storage disks of a disk drive, wherein:
the disk drive comprises a plurality of storage disks implementing a Random Array of Independent Disks (RAID) storage device configuration,
each storage disk of the plurality of storage disks in the RAID storage device configuration includes at least an inner storage track and an outer storage track for storing data,
at least one storage disk in the plurality of storage disks includes a fast storage disk, and at least one storage disk in the plurality of storage disks includes a slow storage disk;
determining a current data transfer speed for each storage location of the plurality of storage locations positioned on the plurality of storage disks based on the monitored data speed characteristics for each storage location, wherein:
each storage location is positioned on a storage track of a storage disk comprising one of:
the outer storage track located on any storage disk of the plurality of storage disks,
the inner storage track located on any storage disk of the plurality of storage disks,
any storage track located on the fast storage disk,
any storage track located on the slow storage disk,
the outer storage track located on the slow storage disk,
the inner storage track located on the slow storage disk,
the outer storage track located on the fast storage disk, and
the inner storage track located on the fast storage disk, and
storage locations located on the outer storage track of each storage disk include faster data transfer speeds than storage locations located on the inner storage track of the same storage disk;
determining data transfer speed differences between each different storage location in the plurality of storage locations located on the plurality of storage disks of the disk drive;
identifying an erasure code technique of a plurality of erasure code techniques associated with a current data chunk of a plurality of data chunks; and
writing the current data chunk to a selected storage location in the plurality of storage locations on the plurality of storage disks of the disk drive,
wherein:
each erasure code technique in the plurality of erasure code techniques is associated with a data transfer speed of a plurality of data transfer speeds,
at least two erasure code techniques include different data transfer speeds of the plurality of data transfer speeds, and
the selected storage location is selected based on an intersection of the current data transfer speed determined for the selected storage location, the erasure code technique associated with the current data chunk, and a data transfer speed difference between the selected storage location and at least one other storage location in the disk drive.

11. The method of claim 10, further comprising monitoring a quantity of consumed storage locations in the plurality of storage locations when storing valid data.

12. The method of claim 11, further comprising:
updating the data transfer speeds for the monitored quantity of consumed storage locations in the plurality of storage locations on the plurality of storage disks of the disk drive; and
updating the data transfer speed differences for the monitored quantity of consumed storage locations in the plurality of storage locations on the plurality of storage disks of the disk drive in response to the current data chunk being written to the selected storage location.

13. The method of claim 10, further comprising classifying the current data chunk as including a data segment or as including a parity segment.

14. The method of claim 13, wherein:
the selected storage location for the data segment is a first selected storage location;
the selected storage location for the parity segment is a second selected storage location;
the first selected storage location includes a faster data transfer speed than the second selected storage location; and
data segments are stored at faster storage locations than parity segments.

15. The method of claim 10, wherein identifying the erasure code technique comprises determining the erasure code technique based on information stored in an erasure code techniques database.

16. A computer program product comprising a computer-readable storage medium including program instructions embodied therewith, the program instructions executable by a processor to cause the processor to:
monitor data transfer speeds for each storage location of a plurality of storage locations positioned on a plurality of storage disks of a disk drive, wherein:
the disk drive comprises a plurality of storage disks implementing a Random Array of Independent Disks (RAID) storage device configuration,
each storage disk of the plurality of storage disks in the RAID storage device configuration includes at least an inner storage track and an outer storage track for storing data,
at least one storage disk in the plurality of storage disks includes a fast storage disk, and
at least one storage disk in the plurality of storage disks includes a slow storage disk;
determine a current data transfer speed for each storage location of the plurality of storage locations positioned on the plurality of storage disks based on the monitored data speed characteristics for each storage location, wherein:
each storage location is positioned on a storage track of a storage disk comprising one of:
the outer storage track positioned on any storage disk of the plurality of storage disks,
the inner storage track positioned on any storage disk of the plurality of storage disks,
any storage track positioned on the fast storage disk,
any storage track positioned on the slow storage disk,
the outer storage track positioned on the slow storage disk,
the inner storage track positioned on the slow storage disk,
the outer storage track positioned on the fast storage disk, and
the inner storage track positioned on the fast storage disk, and
storage locations positioned on the outer storage track of each storage disk include faster data transfer speeds than storage locations positioned the inner storage track of the same storage disk;
determine data transfer speed differences between each different storage location in the plurality of storage locations positioned on the plurality of storage disks of the disk drive;
identify an erasure code technique associated with a current data chunk of a plurality of data chunks; and
write the current data chunk to a selected storage location in the plurality of storage locations,
wherein:

each erasure code technique in the plurality of erasure code techniques is associated with a data transfer speed of a plurality of data transfer speeds, at least two erasure code techniques include different data transfer speeds of the plurality of data transfer speeds, and the selected storage location is selected based on an intersection of the current data transfer speed determined for the selected storage location, the erasure code technique associated with the current data chunk, and a data transfer speed difference between the selected storage location and at least one other storage location in the disk drive.

17. The computer program product of claim 16, the program instructions further causing the processor to:

monitor a quantity of consumed storage locations in the plurality of storage locations when storing valid data;

update the data transfer speeds for the monitored quantity of consumed storage locations in the plurality of storage locations; and update the data transfer speed differences for the monitored quantity of consumed storage locations in the plurality of storage locations in response to the current data chunk being written to the selected storage location.

18. The computer program product of claim 16, the program instructions further causing the processor to classify the data chunk as including a data segment or as including a parity segment.

19. The computer program product of claim 18, wherein:

the selected storage location for the data segment is a first selected storage location;

the selected storage location for the parity segment is a second selected storage location;

the first selected storage location includes a faster data transfer speed than the second selected storage location; and data segments are stored at faster storage locations than parity segments.

20. The computer program product of claim 16, the program instructions further causing the processor to determine the erasure code technique from an erasure code techniques database.

* * * * *